(12) United States Patent
Li et al.

(10) Patent No.: US 10,209,272 B2
(45) Date of Patent: Feb. 19, 2019

(54) TESTING DEVICE

(71) Applicants: BOE Technology Group Co., Ltd., Beijing (CN); Hefei Xinsheng Optoelectronics Technology Co., Ltd., Anhui (CN)

(72) Inventors: Kun Li, Beijing (CN); Chengcheng Hou, Beijing (CN); Shancai Zhang, Beijing (CN); Yueyuan Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/232,907

(22) Filed: Aug. 10, 2016

(65) Prior Publication Data

US 2017/0192035 A1 Jul. 6, 2017

(30) Foreign Application Priority Data

Jan. 4, 2016 (CN) .......................... 2016 1 0005554

(51) Int. Cl.
*G01R 1/04* (2006.01)
*G01R 1/073* (2006.01)

(52) U.S. Cl.
CPC ....... *G01R 1/0416* (2013.01); *G01R 1/07328* (2013.01)

(58) Field of Classification Search
CPC .............. G01R 1/0416; G01R 31/2818; G01R 31/2886; G01R 1/0483; G01R 1/0408; G01R 1/07307; G01R 31/2889
See application file for complete search history.

(56) References Cited

U.S. PATENT DOCUMENTS

2010/0045322 A1* 2/2010 Di Stefano ........ G01R 31/2891
324/756.03
2015/0192610 A1* 7/2015 Tang .................... G01R 1/0491
324/756.02

FOREIGN PATENT DOCUMENTS

CN 201083763 Y 7/2008
CN 103809072 A 5/2014
(Continued)

OTHER PUBLICATIONS

First Office Action, including Search Report, for Chinese Patent Application No. 201610005554.X, dated Oct. 30, 2017, 9 pages.
(Continued)

*Primary Examiner* — Jermele M Hollington
*Assistant Examiner* — Suresh K Rajaputra
(74) *Attorney, Agent, or Firm* — Westman, Champlin & Koehler, P.A.

(57) ABSTRACT

A testing device is disclosed. The testing device includes: a testing platform; an electromagnetic relay platform arranged opposite to the testing platform; and a plurality of probe assemblies disposed between the electromagnetic relay platform and the testing platform. Each of the probe assemblies includes an electromagnetic base and a probe mounted in a side of the electromagnetic base away from the electromagnetic relay platform. Each of the electromagnetic bases is attracted together with the electromagnetic relay platform under an electromagnetic attraction force when the electromagnetic relay platform is energized. The above testing device may be used for testing a variety of circuit boards, and has a relatively wide application.

19 Claims, 2 Drawing Sheets

(56) References Cited

FOREIGN PATENT DOCUMENTS

| | | |
|---|---|---|
| CN | 204789814 U | 11/2015 |
| DE | 26 13 858 B1 | 7/1977 |
| JP | S55-83855 A | 6/1980 |

OTHER PUBLICATIONS

Second Office Action, including Search Report, for Chinese Patent Application No. 201610005554.X, dated Apr. 4, 2018, 11 pages.

\* cited by examiner

TESTING DEVICE

CROSS-REFERENCE TO RELATED APPLICATION

This application claims the benefit of Chinese Patent Application No. 201610005554.X, filed on Jan. 4, 2016, entitled "Testing Device" in the State Intellectual Property Office of China, the whole disclosure of which is incorporated herein by reference.

BACKGROUND OF THE INVENTION

Field of the Invention

The present disclosure relates to a field of circuit board testing technology, and specifically relates to a testing device.

Description of the Related Art

Currently, in general, testing points are previously provided in a printed circuit board assembly (PCBA) when manufacturing the assembly. In conventional testing devices for testing the PCBA, each testing device has probes distributed corresponding to the testing points of the PCBA to be tested, and the functionality of the PCBA is tested by means of connecting the probes with the testing points. Thus, each testing device can only be used for testing one type of PCBA.

Currently, a wide variety of PCBA products are used. Since each type of the PCBA products requires a corresponding testing device, the existing PCBA products have a significantly high design cost. In addition, once a project involving circuit board testing is completed, many testing devices will be left unused, even discarded, resulting in a significant waste in cost.

SUMMARY OF THE INVENTION

The present disclosure provides a testing device, so as to solve the issues that each testing device can only be used for testing one type of circuit board and applied for a relatively small range in the prior art.

In order to achieve the above object, the present disclosure provides the following solutions:

A testing device, comprising:

a testing platform;

an electromagnetic relay platform arranged opposite to the testing platform; and a plurality of probe assemblies disposed between the electromagnetic relay platform and the testing platform, each of the probe assemblies comprising an electromagnetic base and a probe mounted in a side of the electromagnetic base away from the electromagnetic relay platform, wherein each of the electromagnetic bases is attracted together with the electromagnetic relay platform under an electromagnetic attraction force when the electromagnetic relay platform is energized.

In the above testing device, the probe assembly is fixed to the electromagnetic relay platform under the action of the electromagnetic force, therefore, it is possible to fix the probe assembly to the electromagnetic relay platform or detach the probe assembly from the electromagnetic relay platform by means of controlling the electromagnetic force. In particular, when the electromagnetic relay platform is energized, an electromagnetic force may be generated, then the probe assembly may be attracted together with the electromagnetic relay platform due to the action of the electromagnetic force, thereby the probe assembly may be fixed relative to the electromagnetic relay platform, further a circuit board may be tested; and when the electromagnetic relay platform is deenergized, the electromagnetic force is gone, then the probe assembly may be detached from the electromagnetic relay platform and can be moved, thereby positions of the probes may be redistributed, so as to allow the testing device to be used for testing other circuit boards.

Therefore, the above testing device may be used for testing a variety of circuit boards, and has a relatively wide application.

Optionally, in each of the probe assemblies, the probe extends towards the testing platform, and the probe is configured to be telescopically moved in the electromagnetic base in the extension direction thereof.

Optionally, a distance between an end of the probe of at least one of the probe assemblies facing towards the testing platform and the testing platform is different from that between an end of the probe of another one of the probe assemblies facing towards the testing platform and the testing platform.

Optionally, in each of the probe assemblies, the probe is detachably mounted in the electromagnetic base.

Optionally, in each of the probe assemblies, the probe comprises: a telescopic rod mounted in the electromagnetic base; and a probe head detachably mounted on the telescopic rod.

Optionally, all of the probes do not have a same length of the probe heads.

Optionally, in each of the probe assemblies, the electromagnetic base is provided with a guiding slot, an extension direction of which is the same with the extension direction of the probe, and the telescopic rod of the probe is configured to be telescopically moved in the electromagnetic base along the guiding slot.

Optionally, each of the probe assemblies further comprises an elastic element mounted between the electromagnetic base and the telescopic rod.

Optionally, the elastic element is a spring, one end of which is connected to the telescopic rod of the probe, and the other end of which is connected to the electromagnetic base.

Optionally, in each of the probe assemblies, the electromagnetic base is further provided with a baffle, which is arranged perpendicular to the extension direction of the probe and provided with a through hole in which the telescopic rod of the probe is engaged in a clearance fit.

Optionally, a stop is provided on a surface of the telescopic rod of the probe, the stop is disposed between the baffle and the guiding slot and configured to abut the baffle.

Optionally, in each of the probe assemblies, the probe head is provided with a positioning portion at a predetermined level of the probe head away from the end of the probe head facing towards the testing platform.

DETAILED DESCRIPTION OF PREFERRED EMBODIMENTS OF THE INVENTION

The technical solutions of the embodiments of the present disclosure will be clearly and completely described with reference to the accompanying drawings, obviously, the described embodiments are merely a portion of embodiments of the present disclosure, rather than all the embodiments. Based on the embodiments of the present disclosure, all the other embodiments obtained by the person skilled in the art without creative efforts fall into the protection scope of the present disclosure.

Figure 1:
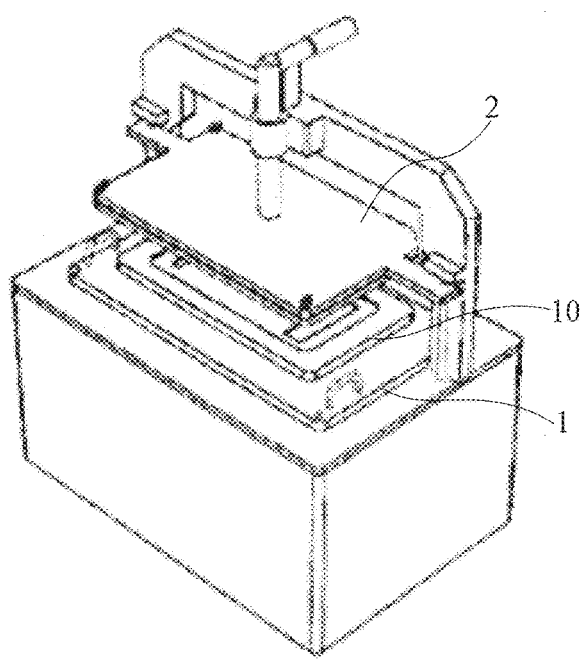
FIG. 1 is a schematic structural view of a testing device according to an embodiment of the present disclosure.
Figure 2:
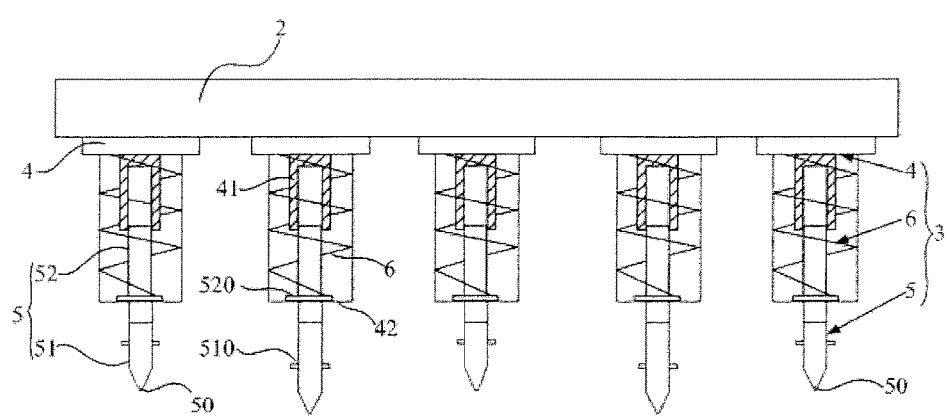
FIG. 2 is a schematic structural view of an electromagnetic relay platform and probe assemblies according to the embodiment of the present disclosure.

As shown in FIGS. 1 and 2, in an embodiment of the present disclosure, there is provided a testing device, comprising:

a testing platform 1;

an electromagnetic relay platform 2 arranged opposite to the testing platform 1; and a plurality of probe assemblies 3 disposed between the electromagnetic relay platform 2 and the testing platform 1, each of the probe assemblies 3 comprising an electromagnetic base 4 and a probe 5 mounted in a side of the electromagnetic base 4 away from the electromagnetic relay platform 2, wherein when the electromagnetic relay platform 2 is energized, each of the electromagnetic bases 4 is attracted together with the electromagnetic relay platform 2 under an electromagnetic attraction force.

In the above testing device, the probe assembly 3 is fixed to the electromagnetic relay platform 2 under the action of the electromagnetic force, therefore, it is possible to fix the probe assembly 3 to the electromagnetic relay platform 2 or detach the probe assembly 3 from the electromagnetic relay platform 2 by means of controlling the electromagnetic force. In particular, when the electromagnetic relay platform 2 is energized, an electromagnetic force may be generated, then the probe assembly 3 may be attracted together with the electromagnetic relay platform 2 due to the action of the electromagnetic attraction force, thereby the probe assembly 3 may be fixed relative to the electromagnetic relay platform 2, further a circuit board 10 may be tested; and when the electromagnetic relay platform 2 is deenergized, the electromagnetic force is gone, then the probe assembly 3 may be detached from the electromagnetic relay platform 2 and can be moved, thereby positions of the probes 5 may be redistributed, so as to allow the testing device to be used for testing other circuit boards 10.

Therefore, the above testing device may be used for testing a variety of circuit boards, and has a relatively wide application.

As shown in FIGS. 1 and 2, as a specific embodiment, in each of the probe assemblies 3, the probe 5 extends towards the testing platform 1, and the probe 5 is configured to be telescopically moved in the electromagnetic base 4 in the extension direction thereof.

Since each of the probes 5 may be telescopically moved in the electromagnetic base 4 in the extension direction thereof, a poor connection between the probes 5 and testing points of the circuit board 10 may be avoided. In particular, when distances between respective ends (detection ends 50) of the probes 5 of the plurality of probe assemblies 3 facing towards the testing platform 1 and the circuit board 10 to be tested are not all the same (i.e., not identical to each other), the probe 5 whose detection end 50 is closer to the circuit board 10 is firstly brought into contact with the circuit board 10 during the electromagnetic relay platform 2 being moved downwards to bring the respective detection ends 50 of the probes 5 into contact with the respective testing points of the circuit board 10. At this time, since the probes 5 may be telescopically moved in the extension direction thereof, the electromagnetic relay platform 2 may be moved downwards continuously, until the probe 5 whose detection end 50 is furthest to the circuit board 10 is brought into contact with the corresponding testing point of the circuit board 10.

Therefore, the testing device of the present disclosure may solve the problem of poor contact between the probe 5 and the circuit board 10 when the detection ends 50 of the probes 5 have different lengths.

As shown in FIGS. 1 and 2, as a specific embodiment, distances between respective ends (the detection ends 50) of the probes 5 of all the probe assemblies 3 facing towards the testing platform 1 and the testing platform 1 are not all the same.

Currently, all the testing devices energize all the testing points of the circuit board 10 at the same time, however, most of the chips have a requirement for an energization sequence in fact. Therefore, if all the testing points are energized at the same time, electronic components may be damaged, or even the circuit board 10 cannot work normally.

When the testing device according to the present disclosure is used for testing the circuit board 10, the circuit board 10 to be tested is placed on the testing platform 1, the distances between the respective detection ends 50 of the probes 10 of all the probe assemblies 3 and the testing platform 1 are not all the same, and the probe 5 may be retracted in the extension direction thereof. Thus, the plurality of probes 5 are successively brought into contact with the respective testing points of the circuit board 10 depending on the lengths of the probes, when the electromagnetic relay platform 2 is moved downwards so as to bring the probes 5 into contact with the respective testing points of the circuit board 10. As a result, the various testing points of the circuit board 10 may be energized by the plurality of probes 5 according to a certain sequence, thereby the testing device according to the present disclosure may satisfy the circuit board 10 with the requirement for the energization sequence.

As shown in FIG. 2, as a specific embodiment, in each of the probe assemblies 3, the probe 5 is detachably mounted in the electromagnetic base 4.

Since the probe 5 is detachably mounted in the electromagnetic base 4, the probe 5 in each electromagnetic base 4 may be replaced. Thus, the probe 5 in the electromagnetic base 4 may be adjusted by replacing the probe 5 in any one of electromagnetic base 4, so as to satisfy the energization requirement of the circuit board 10 to be tested, thereby the testing device according to the present disclosure may satisfy the different circuit boards 10 with the requirement for the energization sequence.

As shown in FIG. 2, as a specific embodiment, in each of the probe assemblies 3, the probe 5 may comprise: a telescopic rod 52 mounted in the electromagnetic base 4; and a probe head 51 detachably mounted on the telescopic rod 52. Optionally, the probe heads 51 of all the probes 5 have different lengths.

The different lengths of the probe heads 51 of all the probes 5 may result in that the distances between the respective detection ends 50 of the probes 5 and the testing platform 1 are not all the same, thereby satisfying the circuit board 10 with the requirement for the energization sequence. Furthermore, since the probe head 51 is detachably mounted on the telescopic rod 52, the different circuit boards 10 to be tested may be further satisfied with the requirement for the energization sequence by means of replacing the probe head 51 having a different length.

In a further embodiment, each telescopic rod 52 and the probe head 51 are detachably connected with each other by a threaded engagement.

As shown in FIG. 2, as a specific embodiment, in each of the probe assemblies 3, the electromagnetic base 4 may be provided with a guiding slot 41, an extension direction of which is the same with the extension direction of the probe 5, and the telescopic rod 52 of the probe 5 may be telescopically moved in the electromagnetic base 4 along the guiding slot 41. The guiding slot 41 may ensure that the probe 5 does not deflect during the telescopic movement, and the probe 5 is more stable and more reliable when being telescopically moved and implementing testing.

As shown in FIG. 2, as a specific embodiment, each of the probe assemblies 3 further comprises an elastic element mounted between the electromagnetic base 4 and the telescopic rod 52. Optionally, the elastic element may be a spring 6, one end of which is connected to the telescopic rod 52 of the probe 5, and the other end of which is connected to the electromagnetic base 4.

By means of the elastic element, the telescopic movement of the probe 5 may be automatically achieved. In particular, during the electromagnetic relay platform 2 being moved downwards to bring the probes 5 into contact with the respective testing points of the circuit board 10, the probe 5 whose detection end 50 is closer to the circuit board 10 is firstly brought into contact with the circuit board 10, and then the probe 5 is retracted in the guiding slot 41 due to a compression force when the electromagnetic relay platform 2 is further moved downwards. The retraction of the probe 5 in the guiding slot 41 may cause the elastic element between the electromagnetic base 4 and the telescopic rod 52 to be compressed, so that the elastic element is in a compression and energy storage state. Thus, when the test is completed, the electromagnetic relay platform 2 will be moved upwards to be away from the circuit board 10, the probe 5 will extend out of the guiding slot 41 under the action of an elastic restoring force of the elastic element, thereby the position and status of the probe 5 is restored.

As shown in FIG. 2, as a specific embodiment, in each of the probe assemblies 3, the electromagnetic base 4 may be further provided with a baffle 42, which is arranged perpendicular to the extension direction of the probe 5 and provided with a through hole in which the telescopic rod 52 of the probe 5 is engaged in a clearance fit. The baffle 42 may limit the probe 5 so that the probe 5 does not deflect during the telescopic movement, and the probe 5 is more stable and more reliable when being telescopically moved and implementing testing.

As shown in FIG. 2, as a preferable embodiment, in each of the probe assemblies 3, a stop 520 is provided on a surface of the telescopic rod 52 of the probe 5, the a stop 520 is disposed between the baffle 42 and the guiding slot 41 and configured to abut the baffle 42.

By means of the stop 520 abutting the baffle 42, the positions of the telescopic rods 52 of the probes 5 may be identical to each other, so as to conveniently select the length of each probe head 51 and determine the distance between the detection end 50 of the probe head 51 and the circuit board 10. Furthermore, by means of the stop 520 abutting the baffle 42, it may avoid the elastic element from being stretched for a long term under the action of gravity, and thereby damaging the elastic performance.

As shown in FIG. 2, in a further alternative embodiment, in each of the probe assemblies 3, the probe head 51 is provided with a positioning portion 510 at a predetermined level of the probe head 51 away from the end (the detection end 50) of the probe head 51 facing towards the testing platform 1.

When the electromagnetic relay platform 2 is moved downwards so that each probe 5 is retracted into the guiding slot 41 until that the positioning portion 510 thereof abuts the baffle 42, the probe 5 will be limited by the baffle 42 to stop the further retraction. At this time, since distances between the respective detection ends 50 of all the probes 5 and the respective positioning portions 510 are identical to each other, distances between the detection ends 50 of all the probes 5 and the respective baffles 42 are identical to each other. Furthermore, levels of the baffles 42 are identical to each other, therefore, it can be determined that the detection ends 50 of all the probes 5 are brought into contact with the circuit board 10. Therefore, it can be easily determined whether the detection ends 50 of all the probes 5 are in contact with the circuit board 10, by means of the provision of the positioning portions 510. In addition, it can avoid the probe 5 from being further refracted when the detection ends 50 of all the probes 5 are brought into contact with the circuit board 10, so as to further avoid the elastic element from being compressed, thereby avoiding the damage to the circuit board due to an overlarge elastic restoring force of the elastic element.

Obviously, various modifications and alternatives may be made to the embodiments of the present disclosure by the person skilled in the art, without deviating from the spirit and scope of the present disclosure. Thus, the present disclosure is intended to contain such modifications and alternatives if such modifications and alternatives fall within the scope of the accompanying claims and the equivalent thereof.

What is claimed is:

1. A testing device, comprising:
   a testing platform;
   an electromagnetic relay platform arranged opposite to the testing platform; and
   a plurality of probe assemblies disposed between the electromagnetic relay platform and the testing platform, each of the probe assemblies comprising an electromagnetic base and a probe mounted in a side of the electromagnetic base away from the electromagnetic relay platform, wherein each of the electromagnetic bases is attracted together with the electromagnetic relay platform under an electromagnetic attraction force when the electromagnetic relay platform is energized; and when the electromagnetic relay platform is deenergized, the electromagnetic force is gone, then the probe assembly is detachable and movable from the electromagnetic relay platform, so as to redistribute positions of the probes,
   wherein, in each of the probe assemblies, the probe extends towards the testing platform, and the probe is configured to be telescopically moved in the electromagnetic base in the extension direction thereof.

2. The testing device according to claim 1, wherein a distance between an end of the probe of at least one of the probe assemblies facing towards the testing platform and the testing platform is different from that between an end of the probe of another one of the probe assemblies facing towards the testing platform and the testing platform.

3. The testing device according to claim 2, wherein, in each of the probe assemblies, the probe is detachably mounted in the electromagnetic base.

4. The testing device according to claim 2, wherein, in each of the probe assemblies, the probe comprises:
   a telescopic rod mounted in the electromagnetic base; and
   a probe head detachably mounted on the telescopic rod.

5. The testing device according to claim 4, wherein all of the probes do not have a same length of the probe heads.

6. The testing device according to claim 4, wherein, in each of the probe assemblies, the electromagnetic base is provided with a guiding slot, an extension direction of which is the same with the extension direction of the probe, and the telescopic rod of the probe is configured to be telescopically moved in the electromagnetic base along the guiding slot.

7. The testing device according to claim 6, wherein each of the probe assemblies further comprises an elastic element mounted between the electromagnetic base and the telescopic rod.

8. The testing device according to claim 7, wherein the elastic element is a spring, one end of which is connected to the telescopic rod of the probe, and the other end of which is connected to the electromagnetic base.

9. The testing device according to claim 7, wherein, in each of the probe assemblies, the electromagnetic base is further provided with a baffle, which is arranged perpendicular to the extension direction of the probe and provided with a through hole in which the telescopic rod of the probe is engaged in a clearance fit.

10. The testing device according to claim 9, wherein, in each of the probe assemblies, a stop is provided on a surface of the telescopic rod of the probe, the stop is disposed between the baffle and the guiding slot and configured to abut the baffle.

11. The testing device according to claim 9, wherein, in each of the probe assemblies, the probe head is provided with a positioning portion at a predetermined level of the probe head away from the end of the probe head facing towards the testing platform.

12. The testing device according to claim 5, wherein, in each of the probe assemblies, the electromagnetic base is provided with a guiding slot, an extension direction of which is the same with the extension direction of the probe, and the telescopic rod of the probe is configured to be telescopically moved in the electromagnetic base along the guiding slot.

13. The testing device according to claim 12, wherein each of the probe assemblies further comprises an elastic element mounted between the electromagnetic base and the telescopic rod.

14. The testing device according to claim 13, wherein the elastic element is a spring, one end of which is connected to the telescopic rod of the probe, and the other end of which is connected to the electromagnetic base.

15. The testing device according to claim 13, wherein, in each of the probe assemblies, the electromagnetic base is further provided with a baffle, which is arranged perpendicular to the extension direction of the probe and provided with a through hole in which the telescopic rod of the probe is engaged in a clearance fit.

16. The testing device according to claim 15, wherein, in each of the probe assemblies, a stop is provided on a surface of the telescopic rod of the probe, the stop is disposed between the baffle and the guiding slot and configured to abut the baffle.

17. The testing device according to claim 15, wherein, in each of the probe assemblies, the probe head is provided with a positioning portion at a predetermined level of the probe head away from the end of the probe head facing towards the testing platform.

18. The testing device according to claim 8, wherein, in each of the probe assemblies, the electromagnetic base is further provided with a baffle, which is arranged perpendicular to the extension direction of the probe and provided with a through hole in which the telescopic rod of the probe is engaged in a clearance fit.

19. The testing device according to claim 18, wherein, in each of the probe assemblies, a stop is provided on a surface of the telescopic rod of the probe, the stop is disposed between the baffle and the guiding slot and configured to abut the baffle.

* * * * *